United States Patent
Kim et al.

(10) Patent No.: US 8,110,908 B2
(45) Date of Patent: Feb. 7, 2012

(54) INTEGRATED CIRCUIT PACKAGING SYSTEM USING BOTTOM FLIP CHIP DIE BONDING AND METHOD OF MANUFACTURE THEREOF

(75) Inventors: YoungJoon Kim, Ichon-si (KR); Ki Youn Jang, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 224 days.

(21) Appl. No.: 12/328,722

(22) Filed: Dec. 4, 2008

(65) Prior Publication Data

US 2010/0140769 A1   Jun. 10, 2010

(51) Int. Cl.
  H01L 23/02 (2006.01)
  H01L 23/34 (2006.01)
  H01L 23/48 (2006.01)
  H01L 21/44 (2006.01)
  H01L 21/48 (2006.01)

(52) U.S. Cl. ........ 257/686; 257/777; 257/723; 257/778; 257/787; 438/109; 438/108; 438/112; 438/127

(58) Field of Classification Search .............. 257/686, 257/777, 778, 724, 783, 779, 780, 782, 784, 257/787, 685, 723, 725, 788, 789, 795; 438/106, 438/108, 109, 110, 127, 124, 112, 126
See application file for complete search history.

(56) References Cited

U.S. PATENT DOCUMENTS

| | | | |
|---|---|---|---|
| 6,114,384 A * | 9/2000 | Bessette et al. | 514/546 |
| 6,229,215 B1 * | 5/2001 | Egawa | 257/777 |
| 6,414,384 B1 | 7/2002 | Lo et al. | |
| 6,921,968 B2 | 7/2005 | Chung | |
| 7,045,887 B2 | 5/2006 | Karnezos | |
| 7,374,967 B2 | 5/2008 | Lee | |
| 2005/0040509 A1 * | 2/2005 | Kikuchi et al. | 257/686 |

* cited by examiner

*Primary Examiner* — Chuong A. Luu
(74) *Attorney, Agent, or Firm* — Mikio Ishimaru

(57) ABSTRACT

A method of manufacture of an integrated circuit packaging system includes: providing a substrate having a substrate cavity; mounting a bottom flip chip die below the substrate; mounting an internal integrated circuit die above the substrate; filling between the internal integrated circuit die and the substrate and between the bottom flip chip die and the substrate with a substance filling through the substrate cavity; and encapsulating the internal integrated circuit die with an encapsulation.

20 Claims, 6 Drawing Sheets

INTEGRATED CIRCUIT PACKAGING SYSTEM USING BOTTOM FLIP CHIP DIE BONDING AND METHOD OF MANUFACTURE THEREOF

TECHNICAL FIELD

The present invention relates generally to integrated circuits and more particularly to a system for utilizing using bottom flip chip die bonding in an integrated circuit packaging system.

BACKGROUND ART

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these packaging systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate having a substrate cavity; mounting a bottom flip chip die below the substrate; mounting an internal integrated circuit die above the substrate; filling between the internal integrated circuit die and the substrate and between the bottom flip chip die and the substrate with a substance filling through the substrate cavity; and encapsulating the internal integrated circuit die with an encapsulation.

The present invention provides an integrated circuit packaging system including: a substrate having a substrate cavity; a bottom flip chip die mounted below the substrate; an internal integrated circuit die mounted above the substrate; a substance filling in the substrate cavity and filling between the internal integrated circuit die and the substrate and between the bottom flip chip die and the substrate; and an encapsulation encapsulating the internal integrated circuit die.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
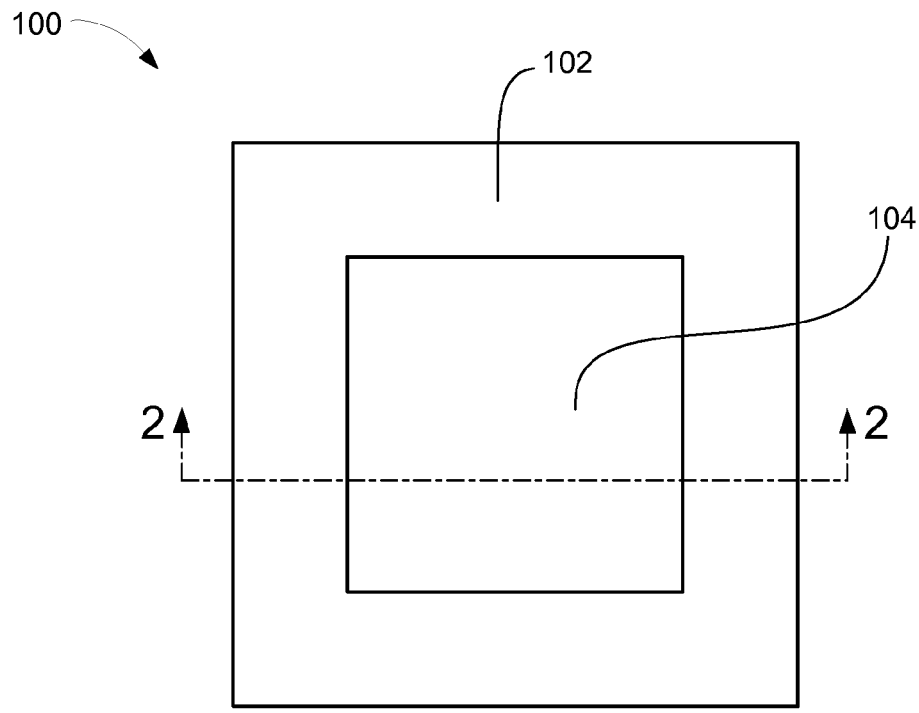
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 is shown having an encapsulation 102 such as a film assisted molding surrounding an internal structure such as an interposer 104.

Figure 2:
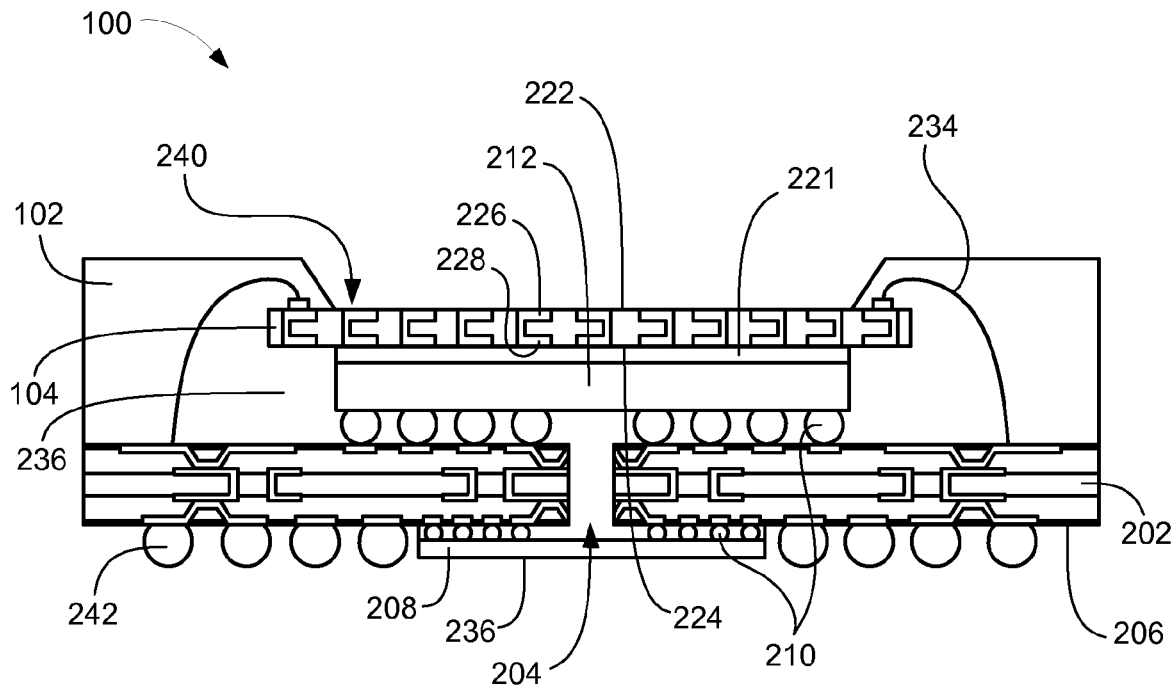
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having a substrate 202 such as a laminated plastic or ceramic substrate.

The substrate 202 has a substrate cavity 204. The substrate cavity 204 may be a cavity made vertically through the substrate 202. Mounted to a bottom surface 206 of the substrate 202 is an integrated circuit such as a bottom flip chip die 208.

The bottom flip chip die 208 is connected to the bottom surface 206 of the substrate 202 with interconnects such as solder ball interconnects 210. The bottom flip chip die 208 may be connected to the substrate 202 on either side of the substrate cavity 204.

Mounted above the substrate 202 is an internal integrated circuit die 212. The internal integrated circuit die 212 is connected to the substrate 202 with the solder ball interconnects 210.

Mounted above the internal integrated circuit die 212 is the interposer 104. The interposer 104 is shown having two functional sides, such as a first functional side 222 and a second functional side 224, which allow for electrical signals to be routed between exposed conductors, such as an exposed conductor 226, exposed from the first functional side 222, and an exposed conductor 228, exposed from the second functional side 224.

The interposer 104 is typically a UV stabilized woven glass and epoxy resin with etched copper conductive pathways. Below the interposer 104, the internal integrated circuit die 212 attached to the second functional side 224 with a die attach adhesive 221.

The first functional side 222 of the interposer 104 is connected to the substrate 202 with internal interconnects such as bond wires 234. The internal integrated circuit die 212 is fully encapsulated with the encapsulation 102, while the bottom flip chip die 208 is only partially encapsulated with the encapsulation 102 leaving an exposed surface 236 un-encapsulated. The encapsulation 102, such as film assisted molding, protects sensitive components from moisture, dust and other contamination.

A substance such as the encapsulation 102 fills between the internal integrated circuit die 212 and the substrate 202 and between the bottom flip chip die 208 and the substrate 202. The encapsulation 102 adds structural rigidity and helps to protect the solder ball interconnects 210 connecting the bottom flip chip die 208 to the substrate 202 from mechanical shock and environmental contamination.

The encapsulation 102 may be injected between the internal integrated circuit die 212 and the substrate 202, through the substrate cavity 204 to fill between the bottom flip chip die 208 and the substrate 202.

It has been discovered that the use of the substrate cavity 204 to facilitate the mounting of the bottom flip chip die 208 to the substrate 202 decreases process time by combining multiple process steps. It has further been discovered that utilizing the bottom flip chip die 208 mounted to the bottom surface 206 of the substrate 202 decreases overall package height.

The encapsulation 102 encapsulates the bond wires 234 connecting the interposer 104 to the substrate 202 and only partially encapsulates the interposer 104 leaving an exposed portion 240 on the first functional side 222 of the interposer 104.

The exposed portion 240 of the interposer 104 may leave open an option to mount other integrated circuit structures to the interposer 104 and external to the integrated circuit packaging system 100. Below the substrate 202 external interconnects 242 such as solder balls are mounted around the bottom flip chip die 208.

Figure 3:
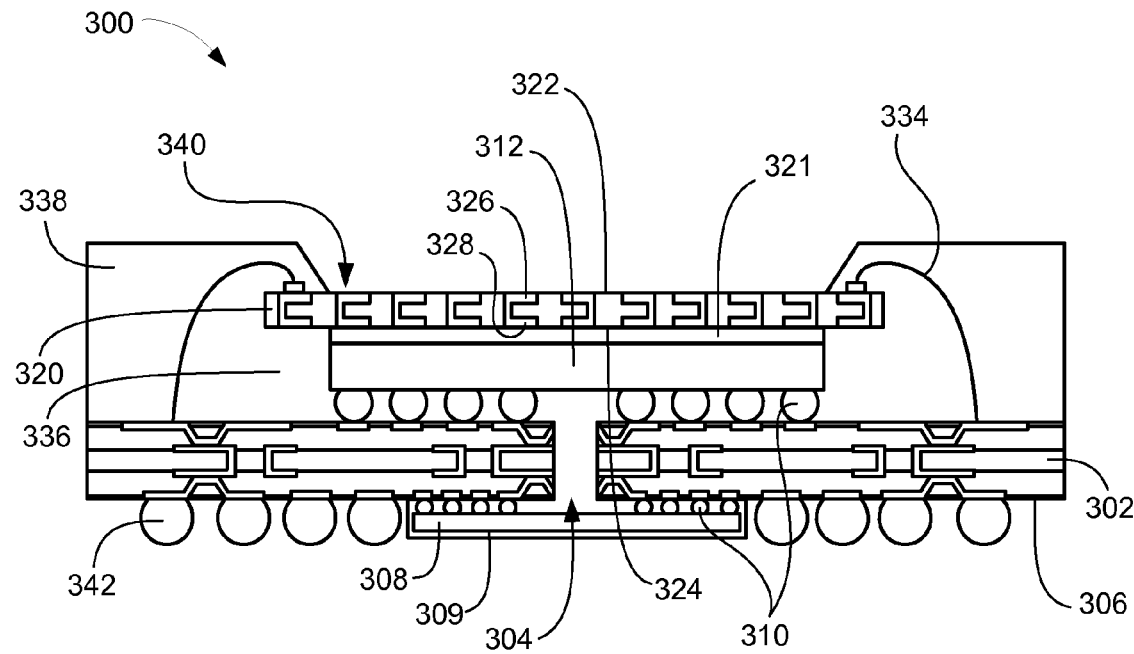
FIG. 3 is a cross-sectional view of an integrated circuit packaging system in a further embodiment of the present invention.

Referring now to FIG. 3, therein is shown a cross-sectional view of an integrated circuit packaging system 300 in a further embodiment of the present invention. The integrated circuit packaging system 300 is shown having a substrate 302 such as a laminated plastic or ceramic substrate.

The substrate 302 has a substrate cavity 304. The substrate cavity 304 may be a cavity made vertically through the substrate 302. Mounted to a bottom surface 306 of the substrate 302 is an integrated circuit such as a bottom flip chip die 308 with a bottom surface 309.

The bottom flip chip die 308 is connected to the bottom surface 306 of the substrate 302 with interconnects such as solder ball interconnects 310. The bottom flip chip die 308 may be connected to the substrate 302 on either side of the substrate cavity 304.

Mounted above the substrate 302 is an internal integrated circuit die 312. The internal integrated circuit die 312 is connected to the substrate 302 with the solder ball interconnects 310.

Mounted above the internal integrated circuit die 312 is an internal structure such as an interposer 320. The interposer 320 is shown having two functional sides, such as a first functional side 322 and a second functional side 324, which allow for electrical signals to be routed between exposed conductors, such as an exposed conductor 326, exposed from the first functional side 322, and an exposed conductor 328, exposed from the second functional side 324.

The interposer 320 is typically a UV stabilized woven glass and epoxy resin with etched copper conductive pathways. Below the interposer 320, the internal integrated circuit die 312 attached to the second functional side 324 with a die attach adhesive 321.

The first functional side 322 of the interposer 320 is connected to the substrate 302 with internal interconnects such as bond wires 334. The internal integrated circuit die 312 and the bottom flip chip die 308 are fully encapsulated with an encapsulation 338. The encapsulation 338, such as film assisted molding, protects sensitive components from moisture, dust and other contamination.

A substance such as the encapsulation 338 fills between the internal integrated circuit die 312 and the substrate 302 and between the bottom flip chip die 308 and the substrate 302. The encapsulation 338 adds structural rigidity and helps to protect the solder ball interconnects 310 connecting the bottom flip chip die 308 to the substrate 302 from mechanical shock and environmental contamination.

The encapsulation 338 may be injected between the internal integrated circuit die 312 and the substrate 302, through the substrate cavity 304 to fill between the bottom flip chip die 308 and the substrate 302.

It has been discovered that the use of the substrate cavity 304 to facilitate the mounting of the bottom flip chip die 308 to the substrate 302 decreases process time by combining multiple process steps. It has further been discovered that utilizing the bottom flip chip die 308 mounted to the bottom surface 306 of the substrate 302 decreases overall package height.

The encapsulation 338 encapsulates the bond wires 334 connecting the interposer 320 to the substrate 302 and only partially encapsulates the interposer 320 leaving an exposed portion 340 on the first functional side 322 of the interposer 320.

The exposed portion 340 of the interposer 320 may leave open an option to mount other integrated circuit structures to the interposer 320 and external to the integrated circuit packaging system 300. Below the substrate 302 external interconnects 342 such as solder balls are mounted around the bottom flip chip die 308.

Figure 4:
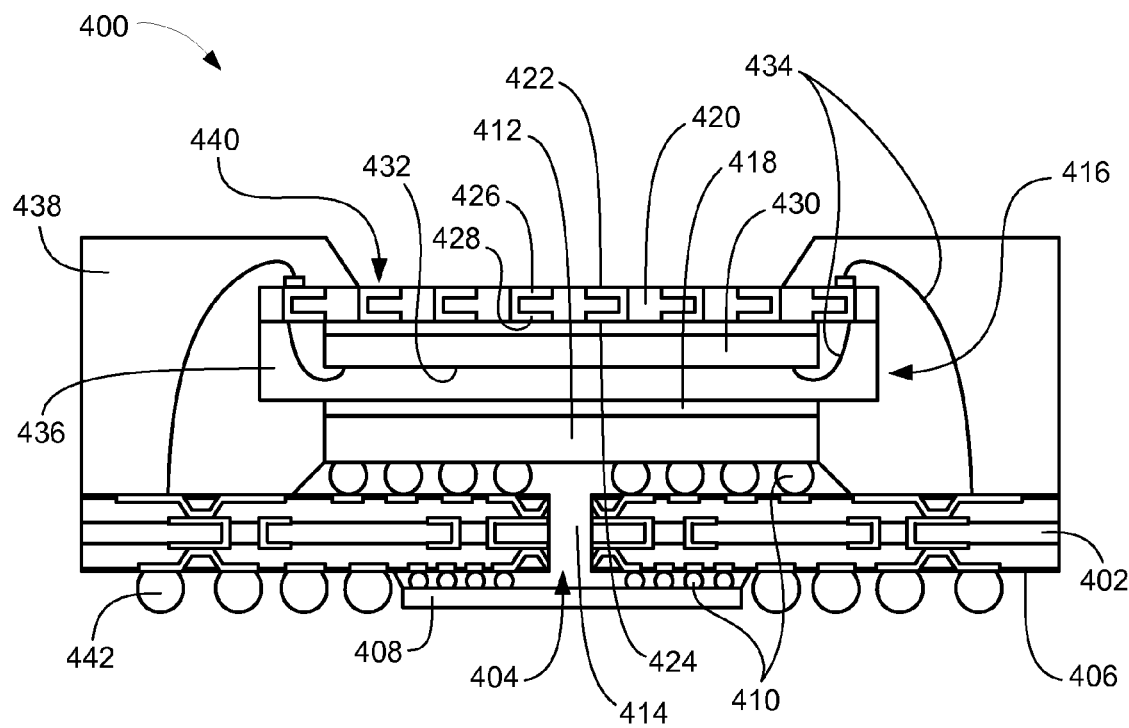
FIG. 4 is a cross-sectional view of an integrated circuit packaging system in a further embodiment of the present invention.

Referring now to FIG. 4, therein is shown a cross-sectional view of an integrated circuit packaging system 400 in a further embodiment of the present invention. The integrated circuit packaging system 400 is shown having a substrate 402 such as a laminated plastic or ceramic substrate.

The substrate 402 has a substrate cavity 404. The substrate cavity 404 may be a cavity made vertically through the substrate 402. Mounted to a bottom surface 406 of the substrate 402 is an integrated circuit such as a bottom flip chip die 408.

The bottom flip chip die 408 is connected to the bottom surface 406 of the substrate 402 with interconnects such as solder ball interconnects 410. The bottom flip chip die 408 may be connected to the substrate 402 on either side of the substrate cavity 404.

Mounted above the substrate 402 is an internal integrated circuit die 412. The internal integrated circuit die 412 is connected to the substrate 402 with the solder ball interconnects 410. The internal integrated circuit die 412 and the bottom flip chip die 408 may be secured to the substrate 402 with an under-fill 414.

A substance such as the under-fill 414 fills between the internal integrated circuit die 412 and the substrate 402 and between the bottom flip chip die 408 and the substrate 402. The under-fill 414 adds structural rigidity and helps to protect the solder ball interconnects 410 connecting the internal integrated circuit die 412 and the bottom flip chip die 408 to the substrate 402 from mechanical shock and environmental contamination.

The under-fill 414 may be injected between the internal integrated circuit die 412 and the substrate 402, through the substrate cavity 404 to fill between the bottom flip chip die 408 and the substrate 402.

It has been discovered that the use of the substrate cavity 404 to facilitate the mounting of the bottom flip chip die 408 to the substrate 402 decreases process time by combining multiple process steps. It has further been discovered that utilizing the bottom flip chip die 408 mounted to the bottom surface 406 of the substrate 402 decreases overall package height.

Mounted above the internal integrated circuit die 412 is an internal structure such as an inner stacking module 416. The inner stacking module 416 is attached to the internal integrated circuit die 412 with a die attach adhesive 418.

The inner stacking module 416 has an inner stacking module interposer 420. The inner stacking module interposer 420 is shown having two functional sides, such as a first functional side 422 and a second functional side 424, which allow for electrical signals to be routed between exposed conductors, such as an exposed conductor 426, exposed from the first functional side 422, and an exposed conductor 428, exposed from the second functional side 424.

The inner stacking module interposer 420 is typically a UV stabilized woven glass and epoxy resin with etched copper conductive pathways. Mounted below the inner stacking module interposer 420 is an inner stacking module die 430 such as a wire-bonded die with an active side 432.

The active side 432 of the inner stacking module die 430 is connected to the inner stacking module interposer 420 with internal interconnects such as bond wires 434. The bond wires 434 and the inner stacking module die 430 are encapsulated by an inner stacking module encapsulation 436 such as a film assisted molding.

The first functional side 422 of the inner stacking module interposer 420 is connected to the substrate 402 with the bond wires 434. The internal integrated circuit die 412 is encapsulated with an encapsulation 438. The encapsulation 438, such as film assisted molding, protects sensitive components from moisture, dust and other contamination.

The encapsulation 438 encapsulates the bond wires 434 connecting the inner stacking module interposer 420 to the substrate 402 and only partially encapsulates the inner stacking module interposer 420 leaving an exposed portion 440 on the first functional side 422 of the inner stacking module interposer 420.

The exposed portion 440 of the inner stacking module interposer 420 may leave open an option to mount other integrated circuit structures to the inner stacking module interposer 420 and external to the integrated circuit packaging system 400. Below the substrate 402 external interconnects 442 such as solder balls are mounted around the bottom flip chip die 408.

Figure 5:
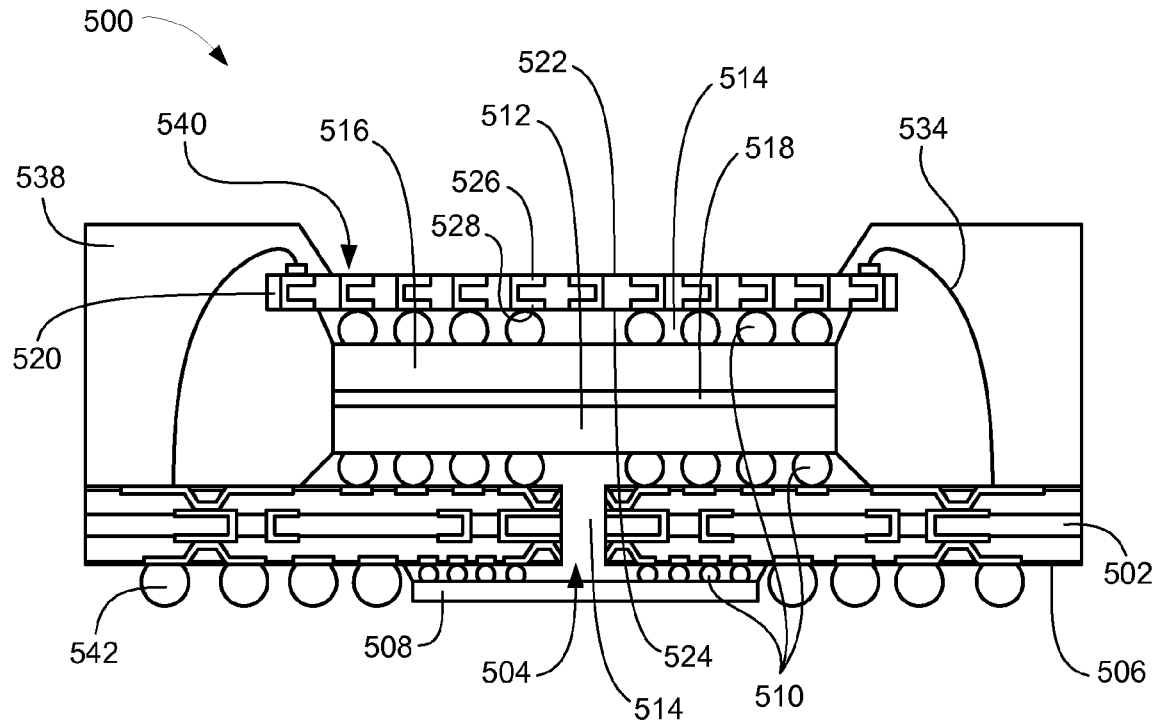
FIG. 5 is a cross-sectional view of an integrated circuit packaging system in a further embodiment of the present invention.

Referring now to FIG. 5, therein is shown a cross-sectional view of an integrated circuit packaging system 500 in a further embodiment of the present invention. The integrated circuit packaging system 500 is shown having a substrate 502 such as a laminated plastic or ceramic substrate.

The substrate 502 has a substrate cavity 504. The substrate cavity 504 may be a cavity made vertically through the substrate 502. Mounted to a bottom surface 506 of the substrate 502 is an integrated circuit such as a bottom flip chip die 508.

The bottom flip chip die 508 is connected to the bottom surface 506 of the substrate 502 with interconnects such as solder ball interconnects 510. The bottom flip chip die 508 may be connected to the substrate 502 on either side of the substrate cavity 504.

Mounted above the substrate 502 is a first internal integrated circuit die 512. The first internal integrated circuit die 512 is connected to the substrate 502 with the solder ball interconnects 510. The first internal integrated circuit die 512 and the bottom flip chip die 508 may be secured to the substrate 502 with an under-fill 514.

A substance such as the under-fill 514 fills between the first internal integrated circuit die 512 and the substrate 502 and between the bottom flip chip die 508 and the substrate 502. The under-fill 514 adds structural rigidity and helps to protect the solder ball interconnects 510 connecting the first internal integrated circuit die 512 and the bottom flip chip die 508 to the substrate 502 from mechanical shock and environmental contamination.

The under-fill 514 may be injected between the first internal integrated circuit die 512 and the substrate 502, through the substrate cavity 504 to fill between the bottom flip chip die 508 and the substrate 502.

It has been discovered that the use of the substrate cavity 504 to facilitate the mounting of the bottom flip chip die 508 to the substrate 502 decreases process time by combining multiple process steps. It has further been discovered that utilizing the bottom flip chip die 508 mounted to the bottom surface 506 of the substrate 502 decreases overall package height.

Mounted above the first internal integrated circuit die 512 is a second internal integrated circuit die 516. The second internal integrated circuit die 516 is attached to the first internal integrated circuit die 512 with a die attach adhesive 518.

Mounted above the second internal integrated circuit die 516 is an internal structure such as an interposer 520. The interposer 520 is shown having two functional sides, such as a first functional side 522 and a second functional side 524, which allow for electrical signals to be routed between exposed conductors, such as an exposed conductor 526, exposed from the first functional side 522, and an exposed conductor 528, exposed from the second functional side 524.

The interposer 520 is typically a UV stabilized woven glass and epoxy resin with etched copper conductive pathways. Below the interposer 520, the second internal integrated circuit die 516 is connected to the second functional side 524 with the solder ball interconnects 510. Surrounding the solder ball interconnects 510 between the second internal integrated circuit die 516 and the interposer 520 is the under-fill 514.

The first functional side 522 of the interposer 520 is connected to the substrate 502 with internal interconnects such as bond wires 534. The first internal integrated circuit die 512 and the second internal integrated circuit die 516 are encapsulated with an encapsulation 538. The encapsulation 538, such as film assisted molding, protects sensitive components from moisture, dust and other contamination.

The encapsulation 538 encapsulates the bond wires 534 connecting the interposer 520 to the substrate 502 and only partially encapsulates the interposer 520 leaving an exposed portion 540 on the first functional side 522 of the interposer 520.

The exposed portion 540 of the interposer 520 may leave open an option to mount other integrated circuit structures to the interposer 520 and external to the integrated circuit packaging system 500. Below the substrate 502 external interconnects 542 such as solder balls are mounted around the bottom flip chip die 508.

Figure 6:
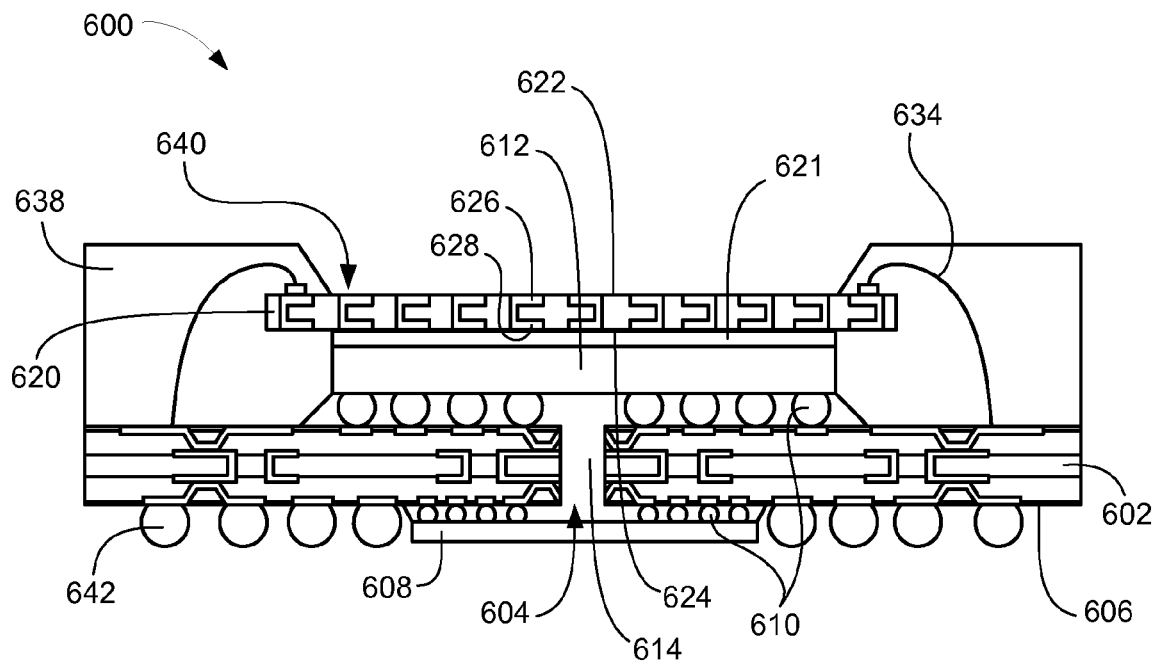
FIG. 6 is a cross-sectional view of an integrated circuit packaging system in a further embodiment of the present invention.

Referring now to FIG. 6, therein is shown a cross-sectional view of an integrated circuit packaging system 600 in a further embodiment of the present invention. The integrated circuit packaging system 600 is shown having a substrate 602 such as a laminated plastic or ceramic substrate.

The substrate 602 has a substrate cavity 604. The substrate cavity 604 may be a cavity made vertically through the substrate 602. Mounted to a bottom surface 606 of the substrate 602 is an integrated circuit such as a bottom flip chip die 608.

The bottom flip chip die 608 is connected to the bottom surface 606 of the substrate 602 with interconnects such as solder ball interconnects 610. The bottom flip chip die 608 may be connected to the substrate 602 on either side of the substrate cavity 604.

Mounted above the substrate 602 is an internal integrated circuit die 612. The internal integrated circuit die 612 is connected to the substrate 602 with the solder ball interconnects 610. The internal integrated circuit die 612 and the bottom flip chip die 608 may be secured to the substrate 602 with an under-fill 614.

A substance such as the under-fill 614 fills between the internal integrated circuit die 612 and the substrate 602 and between the bottom flip chip die 608 and the substrate 602. The under-fill 614 adds structural rigidity and helps to protect the solder ball interconnects 610 connecting the internal integrated circuit die 612 and the bottom flip chip die 608 to the substrate 602 from mechanical shock and environmental contamination.

The under-fill 614 may be injected between the internal integrated circuit die 612 and the substrate 602, through the substrate cavity 604 to fill between the bottom flip chip die 608 and the substrate 602.

It has been discovered that the use of the substrate cavity 604 to facilitate the mounting of the bottom flip chip die 608 to the substrate 602 decreases process time by combining multiple process steps. It has further been discovered that utilizing the bottom flip chip die 608 mounted to the bottom surface 606 of the substrate 602 decreases overall package height.

Mounted above the internal integrated circuit die 612 is an internal structure such as an interposer 620. The interposer 620 is shown having two functional sides, such as a first functional side 622 and a second functional side 624, which allow for electrical signals to be routed between exposed conductors, such as an exposed conductor 626, exposed from the first functional side 622, and an exposed conductor 628, exposed from the second functional side 624.

The interposer 620 is typically a UV stabilized woven glass and epoxy resin with etched copper conductive pathways. Below the interposer 620, the internal integrated circuit die 612 attached to the second functional side 624 with a die attach adhesive 621.

The first functional side 622 of the interposer 620 is connected to the substrate 602 with internal interconnects such as bond wires 634. The internal integrated circuit die 612 is encapsulated with an encapsulation 638. The encapsulation 638, such as film assisted molding, protects sensitive components from moisture, dust and other contamination.

The encapsulation 638 encapsulates the bond wires 634 connecting the interposer 620 to the substrate 602 and only partially encapsulates the interposer 620 leaving an exposed portion 640 on the first functional side 622 of the interposer 620.

The exposed portion 640 of the interposer 620 may leave open an option to mount other integrated circuit structures to the interposer 620 and external to the integrated circuit packaging system 600. Below the substrate 602 external interconnects 642 such as solder balls are mounted around the bottom flip chip die 608.

Figure 7:
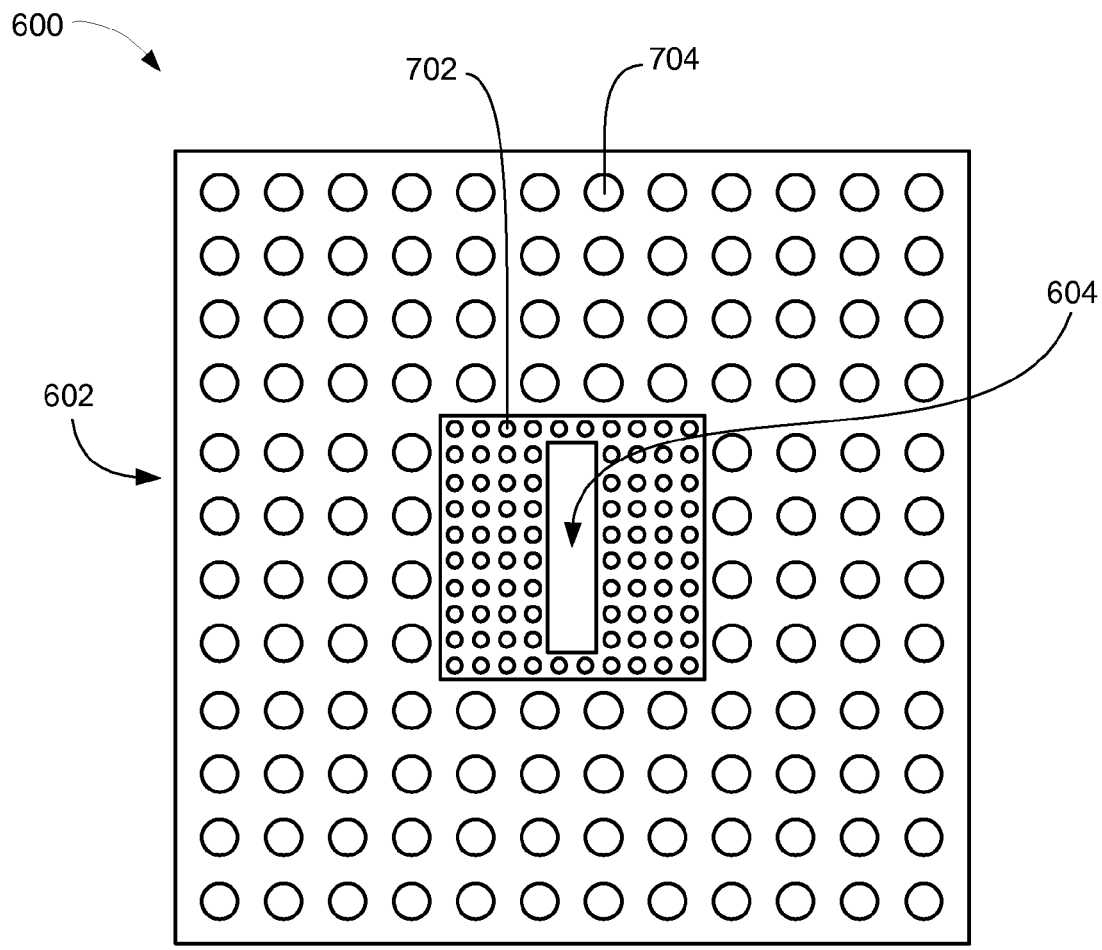
FIG. 7 is a bottom view of the integrated circuit packaging system of FIG. 6 in a substrate providing phase of manufacture.

Referring now to FIG. 7, therein is shown a bottom view of the integrated circuit packaging system 600 of FIG. 6 in a substrate providing phase of manufacture. The integrated circuit packaging system 600 is shown having the substrate 602. The substrate 602 is shown having solder bump pads 702 and solder ball pads 704. The substrate 602 is also shown having the substrate cavity 604 in the center of the substrate 602.

Figure 8:
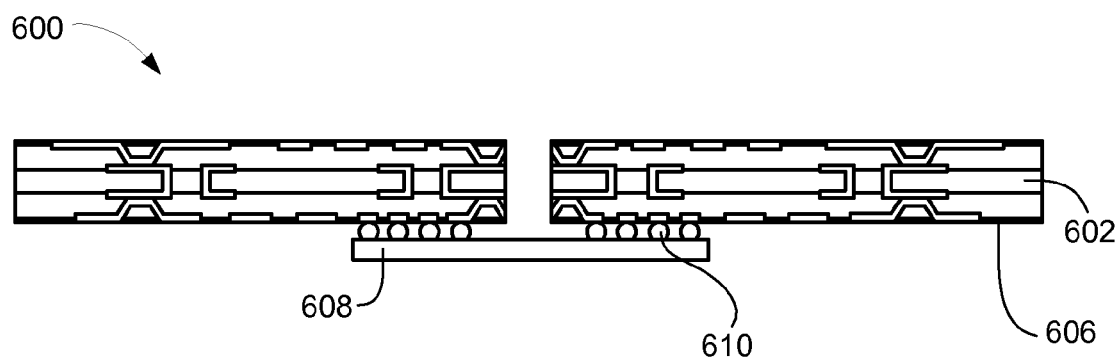
FIG. 8 is the integrated circuit packaging system of FIG. 6 after a bottom flip chip die mounting phase of manufacture.

Referring now to FIG. 8, therein is shown the integrated circuit packaging system 600 of FIG. 6 after a bottom flip chip die mounting phase of manufacture. The integrated circuit packaging system 600 is shown having the bottom flip chip die 608 mounted to the bottom surface 606 of the substrate 602 and connected with the solder ball interconnects 610.

Figure 9:
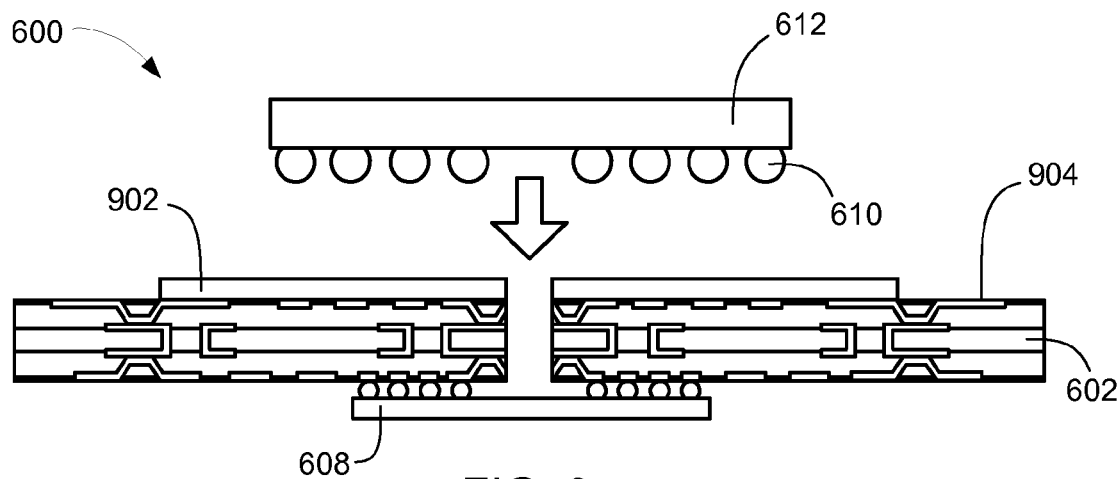
FIG. 9 is the integrated circuit packaging system of FIG. 6 in an internal integrated circuit die mounting phase of manufacture.

Referring now to FIG. 9, therein is shown the integrated circuit packaging system 600 of FIG. 6 in an internal integrated circuit die mounting phase of manufacture. The integrated circuit packaging system 600 is shown having jet flux 902 applied to an upper surface 904 of the substrate 602. The internal integrated circuit die 612 is being mounted through the jet flux 902. The jet flux 902 will be removed in a later process stage.

After the bottom flip chip die mounting phase of manufacture, there is a risk of oxidation on the upper surface 904 of the substrate 602. Using jet flux 902 on the upper surface 904 of the substrate 602 when mounting the internal integrated circuit die 612 reduces poor connections between the solder ball interconnects 610 and the substrate 602.

Figure 10:
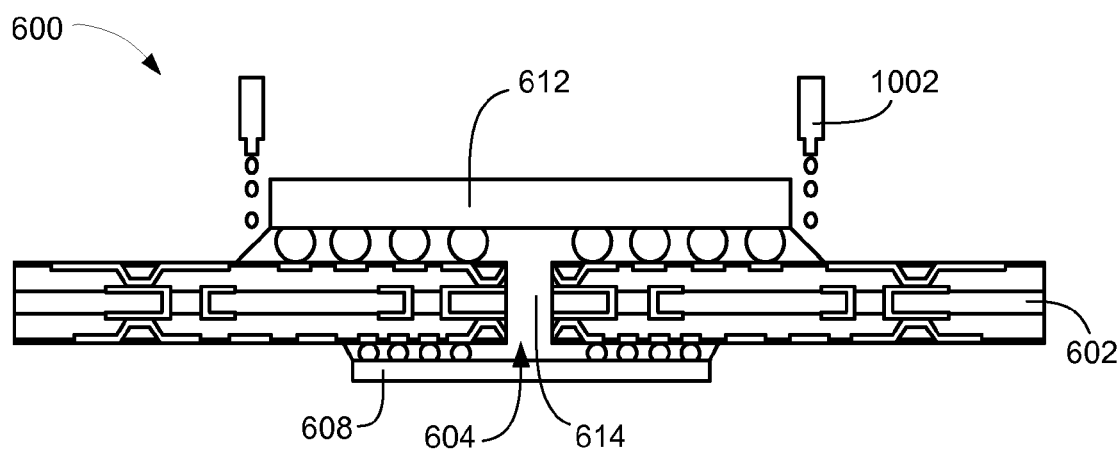
FIG. 10 is the integrated circuit packaging system of FIG. 6 in an under-fill phase of manufacture.

Referring now to FIG. 10, therein is shown the integrated circuit packaging system 600 of FIG. 6 in an under-fill phase of manufacture. The integrated circuit packaging system 600 is shown having the under-fill 614 injected between the internal integrated circuit die 612 and the substrate 602, through the substrate cavity 604 to fill between the bottom flip chip die 608 and the substrate 602. Multiple injectors 1002 may be used to inject the under-fill 614.

Figure 11:
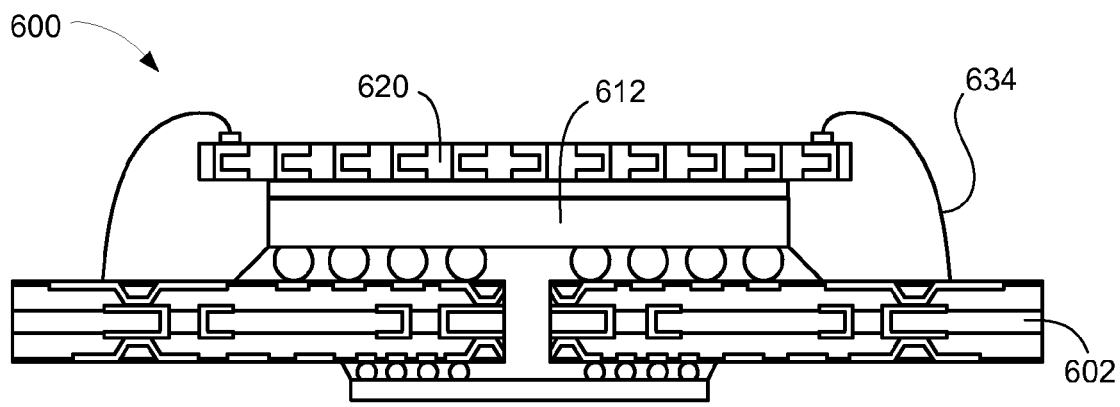
FIG. 11 is the integrated circuit packaging system of FIG. 6 after a wire-bonding phase of manufacture.

Referring now to FIG. 11, therein is shown the integrated circuit packaging system 600 of FIG. 6 after a wire-bonding phase of manufacture. The integrated circuit packaging system 600 is shown having the interposer 620 mounted over the internal integrated circuit die 612 and connected to the substrate 602 with the bond wires 634.

Figure 12:
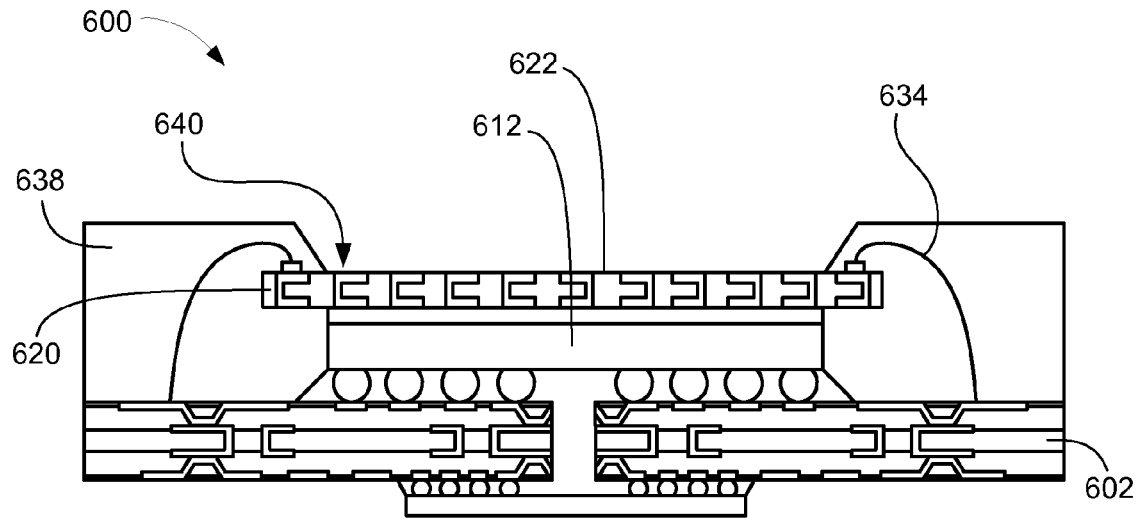
FIG. 12 is the integrated circuit packaging system of FIG. 6 after an encapsulation phase of manufacture.

Referring now to FIG. 12, therein is shown the integrated circuit packaging system 600 of FIG. 6 after an encapsulation phase of manufacture. The integrated circuit packaging system 600 is shown having the encapsulation 638 encapsulating the bond wires 634 connecting the interposer 620 to the substrate 602 and only partially encapsulates the interposer 620 leaving an exposed portion 640 on the first functional side 622 of the interposer 620. The encapsulation 638 is also shown encapsulating the internal integrated circuit die 612.

Figure 13:
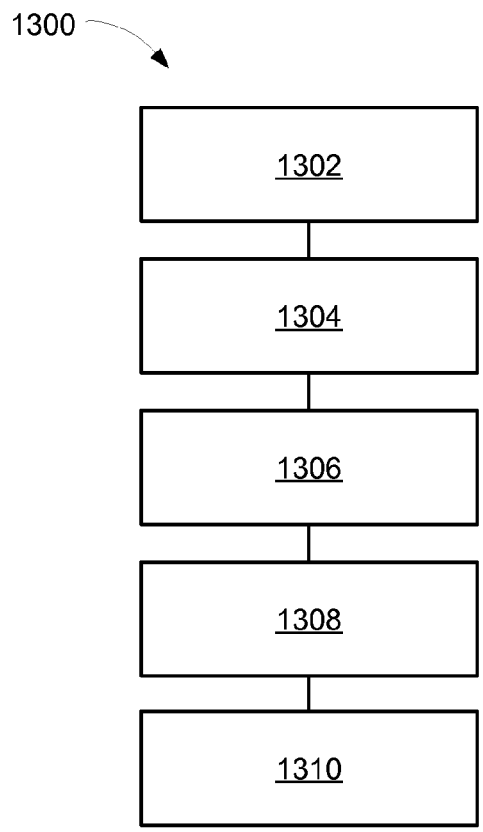
FIG. 13 is a flow chart of a method of manufacture of the integrated circuit packaging system of FIG. 1 in a further embodiment of the present invention.

Referring now to FIG. 13, therein is shown a flow chart of a method 1300 of manufacture of the integrated circuit packaging system 100 of FIG. 1 in a further embodiment of the present invention. The method 1300 includes providing a substrate having a substrate cavity in a block 1302; mounting a bottom flip chip die below the substrate in a block 1304; mounting an internal integrated circuit die above the substrate in a block 1306; filling between the internal integrated circuit die and the substrate and between the bottom flip chip die and the substrate with a substance filling through the substrate cavity in a block 1308; and encapsulating the internal integrated circuit die with an encapsulation in a block 1310; in a block 1312; in a block 1313; in a block 1316; in a block 1318; and in a block 1320.

Thus, it has been discovered that the bottom flip chip die bonding system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate having a substrate cavity;
   mounting a bottom flip chip die below the substrate;
   mounting an internal integrated circuit die above the substrate;
   mounting an internal structure above the internal integrated circuit die;
   applying an under-fill in the substrate cavity, between the internal integrated circuit die and the substrate, and between the bottom flip chip die and the substrate; and
   forming an encapsulation enclosing the internal integrated circuit die and the under-fill with the encapsulation exposing a portion of the internal structure.

2. The method as claimed in claim 1 wherein:
   applying the under-fill includes applying a substance such as the encapsulation in the substrate cavity, between the internal integrated circuit die and the substrate, and between the bottom flip chip die and the substrate.

3. The method as claimed in claim 1 wherein:
   forming the encapsulation includes enclosing the bottom flip chip die with the encapsulation.

4. The method as claimed in claim 1 wherein:
   applying the under-fill includes the bottom flip chin die partially exposed from the under-fill.

5. The method as claimed in claim 1 further comprising:
   connecting the bottom flip chip die to the substrate with solder ball interconnects.

6. A method of manufacture of an integrated circuit packaging system comprising:
   providing a substrate having a substrate cavity;
   mounting a bottom flip chip die below the substrate;
   mounting an internal integrated circuit die above the substrate;

applying an under-fill in the substrate cavity, between the internal integrated circuit die and the substrate, and between the bottom flip chip die and the substrate;
mounting an internal structure over the internal integrated circuit die;
connecting the internal structure to the substrate with bond wires; and
forming an encapsulation enclosing the internal integrated circuit die and an under-fill with the encapsulation exposing a portion of the internal structure.

7. The method as claimed in claim 6 wherein:
mounting the internal structure includes mounting an interposer, or an inner stacking module.

8. The method as claimed in claim 6 further comprising:
mounting a second internal integrated circuit die above the internal integrated circuit die.

9. The method as claimed in claim 6 wherein:
mounting the internal integrated circuit die includes applying jet flux to an upper surface of the substrate.

10. The method as claimed in claim 6 further comprising:
connecting the internal integrated circuit die to the substrate with solder ball interconnects.

11. An integrated circuit packaging system comprising:
a substrate having a substrate cavity;
a bottom flip chip die mounted below the substrate;
an internal integrated circuit die mounted above the substrate;
an internal structure mounted over the internal integrated circuit die;
an under-fill in the substrate cavity, between the internal integrated circuit die and the substrate, and between the bottom flip chip die and the substrate; and
an encapsulation encapsulating the internal integrated circuit die and the under-fill, a portion of the internal structure exposed from the encapsulation.

12. The system as claimed in claim 11 wherein: the under-fill is a substance such as the encapsulation.

13. The system as claimed in claim 11 further comprising:
an exposed surface exposed from the substance.

14. The system as claimed in claim 11 further comprising:
a bottom surface of the bottom flip chip die encapsulated by the encapsulation.

15. The system as claimed in claim 11 further comprising:
solder ball interconnects connecting the bottom flip chip die to the substrate.

16. The system as claimed in claim 11 further comprising:
bond wires connecting the internal structure to the substrate.

17. The system as claimed in claim 16 wherein:
the internal structure is an interposer, or an inner stacking module.

18. The system as claimed in claim 16 further comprising:
a second internal integrated circuit die mounted above the internal integrated circuit die.

19. The system as claimed in claim 16 further comprising:
a die attach adhesive attaching the internal structure to the internal integrated circuit die.

20. The system as claimed in claim 16 further comprising:
solder ball interconnects connecting the internal integrated circuit die to the substrate.

* * * * *

UNITED STATES PATENT AND TRADEMARK OFFICE
CERTIFICATE OF CORRECTION

PATENT NO.        : 8,110,908 B2
APPLICATION NO.   : 12/328722
DATED             : February 7, 2012
INVENTOR(S)       : Kim et al.

It is certified that error appears in the above-identified patent and that said Letters Patent is hereby corrected as shown below:

Column 10:
claim 4, line 57, delete "bottom flip chin die" and insert therefor --bottom flip chip die--

Signed and Sealed this
Twenty-fifth Day of September, 2012

David J. Kappos
*Director of the United States Patent and Trademark Office*